United States Patent
Griffin

(10) Patent No.: US 7,024,056 B2
(45) Date of Patent: Apr. 4, 2006

(54) ELECTRO-OPTIC GATING ARRANGEMENT WITH IMPROVED DUTY CYCLE

(75) Inventor: Robert Griffin, Towcester (GB)

(73) Assignee: Bookham Technology, plc, Towcester (GB)

( * ) Notice: Subject to any disclaimer, the term of this patent is extended or adjusted under 35 U.S.C. 154(b) by 0 days.

(21) Appl. No.: 10/469,370

(22) PCT Filed: Mar. 1, 2002

(86) PCT No.: PCT/GB02/00897

§ 371 (c)(1),
(2), (4) Date: Aug. 27, 2003

(87) PCT Pub. No.: WO02/071598

PCT Pub. Date: Sep. 12, 2002

(65) Prior Publication Data

US 2004/0070832 A1     Apr. 15, 2004

(30) Foreign Application Priority Data

Mar. 2, 2001     (GB) .................................. 0105137

(51) Int. Cl.
G02F 1/01     (2006.01)
(52) U.S. Cl. ........................ 385/1; 385/2; 385/3; 385/9; 398/186; 398/187; 398/188; 398/192; 359/248; 359/249; 359/276; 359/278; 359/279
(58) Field of Classification Search ................ 385/2, 385/3; 359/245
See application file for complete search history.

(56) References Cited

U.S. PATENT DOCUMENTS

| | | | | |
|---|---|---|---|---|
| 4,114,257 A * | 9/1978 | Bellavance | ................... | 438/24 |
| 4,505,587 A * | 3/1985 | Haus et al. | .................. | 356/478 |
| 5,210,633 A * | 5/1993 | Trisno | ......................... | 398/193 |
| 5,777,777 A * | 7/1998 | Kaste et al. | ................. | 359/245 |
| 6,061,161 A * | 5/2000 | Yang et al. | .................. | 398/194 |
| 6,552,624 B1 * | 4/2003 | Fuerst et al. | ................. | 332/106 |
| 6,559,996 B1 * | 5/2003 | Miyamoto et al. | .......... | 398/183 |
| 6,643,051 B1 * | 11/2003 | Fuerst et al. | ................. | 359/279 |
| 2003/0002112 A1 * | 1/2003 | Hirano et al. | ................ | 359/161 |
| 2003/0007217 A1 * | 1/2003 | Fuerst et al. | ................. | 359/161 |
| 2003/0058503 A1 * | 3/2003 | Lou et al. | .................... | 359/158 |
| 2004/0061922 A1 * | 4/2004 | Mauro et al. | ................ | 359/279 |
| 2004/0252929 A1 * | 12/2004 | Kim et al. | ...................... | 385/1 |

FOREIGN PATENT DOCUMENTS

| EP | 0 475 376 A2 | 3/1992 |
|---|---|---|
| EP | 0 488 469 A1 | 6/1992 |
| EP | 488469 A1 * | 6/1992 |

* cited by examiner

*Primary Examiner*—Frank G. Font
(74) *Attorney, Agent, or Firm*—Lahive & Cockfield, LLP; Anthony A. Laurentano, Esq.

(57) ABSTRACT

The device includes an oscillator (1) to generate an electrical signal of a predetermined frequency and a signal divider (2) to split the electrical signal into first and second signals. The frequency of the second signal is tripled by tripler (3) and the tripled second signal is recombined with the first signal at signal adder (9) to produce a combined electrical signal. This combined electrical signal drives a Mach-Zehnder modulator (10).

15 Claims, 2 Drawing Sheets

ELECTRO-OPTIC GATING ARRANGEMENT WITH IMPROVED DUTY CYCLE

RELATED APPLICATIONS

This application is a 35 U.S.C. 371 national stage filing of International Application No. PCT/GB02/00897, filed 1 Mar. 2002, which claims priority to Great Britain Patent Application No. 0105137.4, filed on 2 Mar. 2001, in Great Britain. The contents of the aforementioned applications are hereby incorporated by reference.

TECHNICAL FIELD

The present invention relates to an electro-optic gating device for use in optical communications systems. More particularly, but not exclusively, it relates to an electro-optic gating device capable of generating pulses of improved duty cycle for use in an optical communications system using a return-to-zero signalling format, and to a method of employing such a device.

BACKGROUND ART

A repetitive electro-optical gate can perform several functions in an optical transmission link. A particularly important function is to generate an output optical pulse stream from a continuous wave optical input. An optical pulse stream is required for transmission in return-to-zero (RZ) format.

Conventional non-return-to-zero (NRZ) format signalling is reaching its practical limits at data rates approaching 10 Gb/s. RZ signalling, superimposing the data on a stream of discrete pulses, has been demonstrated to be more tolerant to impairments due to optical non-linearity, which limit performance in amplified, dispersion managed optical links. The RZ format is therefore likely to be deployed in fixture optical networks, such as dense wavelength-division multiplexed (WDM) optical networks transmitting 10 Gb/s over long spans and planned networks using data rates of 40 Gb/s and above per channel over shorter spans.

An electro-optic gate may also be used to demultiplex a stream of optical pulses. When the electrical drive signal to such a gate is synchronised with the pulse rate B of the stream, the gate may be used to select every $n^{th}$ pulse from the stream, where n is an integer. Such optical demultiplexing allows transmission at data rates exceeding the capabilities of existing electronic components, since the electronic components are only required to operate on a demultiplexed signal at a rate of B/n.

RZ signal generation requires a source of short optical pulses with repetition rate corresponding to the bit rate of the channel along which the signal is to be transmitted. The train of pulses from the source may then be further-gated with an intensity modulator to provide a stream of RZ format data. An important parameter of the source is the duty cycle of the pulse train that it generates. The duty cycle is defined as the ratio of the full-width half-maximum intensity of the pulse, Δ, to the pulse repetition period T. A sharp, distinct pulse thus has a low duty cycle.

The optimum duty cycle of a pulse train depends on the details of the particular transmission system in use. A low duty cycle can minimise impairment due to self phase modulation. Impairments due to cross-phase modulation and adjacent channel crosstalk may be minimised with a duty cycle of around 0.5; but a significantly lower duty cycle can lead to problems with frequency spread. There is thus a need to provide an adjustable RZ source, in which the pulse duty cycle may be adjusted to an optimum level for the properties of the particular system in which it is used.

When several independent RZ data streams are to be multiplexed together to give a higher rate aggregate pulse stream, the duty cycle of each independent RZ data stream must be sufficiently low to prevent overlap of pulses in the aggregate stream after multiplexing. This maintains data integrity and facilitates demultiplexing when the signal is received. To successfully multiplex n data streams, the duty cycle of each stream should be less than ½n. Similarly, to demultiplex a stream of n components, the duty cycle of the optical gate should again be ½n or lower.

Such electro-optical gates are conventionally based on Mach-Zehnder modulators. An electrical signal alters the refractive index along the path taken by one half of a split coherent optical input. The phase of this half is thus altered, such that when both halves are recombined, constructive or destructive interference may occur. A suitable electrical signal input to a Mach-Zehnder modulator thereby operates it as an on/off optical gate. Mach-Zehhnder modulators can be realised in $LiNbO_3$ (lithium niobate), GaAs (gallium arsenide), AlGaAs (aluminium gallium arsenide or other electro-optic materials.

To achieve the lowest duty cycle from a Mach-Zehnder modulator, the modulator is biased for maximum optical transmission and is driven with an electrical signal of amplitude twice the switching voltage. When the input electrical signal is a pure simusoidal oscillator signal, this provides an output of optical pulses at twice the frequency of the input electrical signal, with a duty cycle of about 0.35. This duty cycle is not low enough for many systems, particularly for effective multiplexing, and it is impractical to vary it without harming other essential parameters, such as extinction ratio.

Consideration has been given to using electro-absorption modulators instead of electro-optic gating devices. These have a non-linear light-voltage response and can be induced to achieve low duty cycle gating. However, such devices are extremely limited in the range of optical wavelengths at which they work. Mach-Zehnder modulators can be produced to cover a very broad wavelength range, including those at which current and envisaged optical communications networks are planned to operate.

It is known that a plurality of Mach-Zehnder modulators may be concatenated to produce a pulse stream of lower duty cycle, albeit at the expense of increased complexity and cost. However, such a system is able to operate only at a single non-adjustable duty cycle.

It is therefore an object of the present invention to provide an electro-optical gating device which is operable at a duty cycle lower than that achievable with current electro-optical gating devices and which is capable of adjustment to operate at a duty cycle most appropriate to a given optical data transmission system. It is a further object of the present invention to provide a method for operating such a device.

DISCLOSURE OF THE INVENTION

According to a first aspect of the present invention, there is provided an electro-optical gating device comprising oscillator means to generate an electrical signal of a predetermined frequency, means to split said electrical signal into first and second signals, means to triple the frequency of said second signal, means to recombine said tripled second signal with said first signal to produce a combined electrical signal, and modulator means adapted to be driven by said combined electrical signal.

The modulator means is preferably a Mach-Zehnder modulator.

Preferably, the gating device comprises amplifier means adapted to act on the tripled harmonic second signal.

Advantageously, said amplifier means comprises variable gain amplifier means adapted to allow adjustment of an amplitude of the harmonic second signal relative to an amplitude of the fundamental first signal.

The gating device may comprise additionally or alternatively amplifier means, optionally variable gain amplifier means, adapted to act on the fundamental first signal.

The gating device may comprise signal filtering means adapted to remove from one or both of said first and second signals components added thereto by the amplifier means, such as components resulting from amplifier non-linearity.

Preferably, the gating device comprises adjustable phase shifting means adapted to act on one or each of the first and second signals to provide phase control between said signals.

The gating device may comprise phase inversion means adapted to act on either said harmonic second signal or said fundamental first signal to invert the phase thereof.

The gating device may comprise at least two Mach-Zehnder modulators adapted to act in series on a single input optical signal, and adapted to be driven by a single combined electrical signal.

Phase adjustment means may be provided to ensure that said at least two Mach-Zehnder modulators act in phase on said single input optical signal.

The device may comprise a monolithic microwave integrated circuit, optionally an integrated circuit based on a III–V semi-conductor material, such as gallium arsenide.

The gating device may be adapted to generate an optical pulse train output from a continuous optical input.

Alternatively, the gating device may be adapted to demultiplex a particular optical pulse train from an aggregate optical pulse stream comprising a plurality of multiplexed optical pulse trains.

According to a second aspect of the present invention, there is provided a method for driving a modulator comprising the steps of generating an electrical signal of a predetermined frequency, splitting said electrical signal into first and second signals, tripling the frequency of the second signal, recombining the first signal and the tripled second signal to produce a combined electrical signal and applying said combined electrical signal to the modulator as a driving signal.

Preferably, the method comprises the step of amplifying the tripled harmonic second signal.

The method may comprise the step of filtering one or each of the harmonic second signal and the fundamental first signal to remove components added thereto by the amplification step, such as components resulting from amplifier non-linearity. Advantageously, the amplitude of the harmonic second signal may be so adjusted relative to the amplitude of the fundamental first signal as to give a required duty cycle performance from the Mach-Zehnder modulator.

The method may comprise the step of so shifting the phase of either the harmonic second signal or the fundamental first signal that they are in phase when recombined.

Alternatively, the method may comprise the step of so shifting the phase of either the harmonic second signal or the fundamental first signal that they are 180° out of phase when recombined.

A continuous optical input may be provided to the Mach-Zehnder modulator to generate an optical pulse train output.

Alternatively, an aggregate optical pulse stream comprising a plurality of multiplexed optical pulse trains may be provided to said Mach-Zehnder modulator to demultiplex a particular optical pulse train.

BRIEF DESCRIPTION OF DRAWINGS

Embodiments of the present invention will now be more particularly described, by way of example and with reference to the accompanying drawings, in which.

BEST MODE OF CARRYING OUT THE INVENTION

Figure 1:
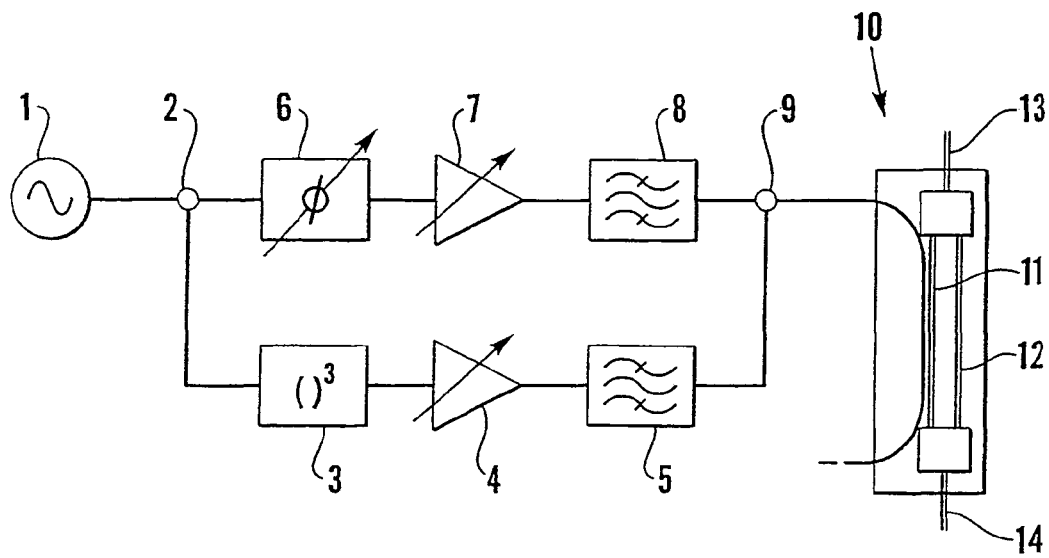
FIG. 1 is a schematic representation of an electro-optical gating device embodying the invention.

Referring now to the drawings, and to FIG. 1 in particular, an electro-optical gating device comprises an oscillator 1, which generates a substantially sinusoidal electrical signal of predetermined frequency $f_{LO}$. A signal divider 2 separates said electrical signal into first and second signals.

The first signal is passed through an adjustable phase shifter 6, a first variable gain amplifier 7 and a first band pass filter 8 to remove from the fundamental first signal any extraneous harmonics which may be introduced by non-linearity in the first amplifier 7.

The second signal is passed through a frequency tripler 3, a second variable gain amplifier 4 and a second band pass filter 5.

The frequency tripler 3, which is a non-linear device, for example a device comprising overdriven balanced amplifiers, triples the frequency of the second signal to $3f_{LO}$, such that it forms a third harmonic of the first signal. The bias of the second variable gain amplifier 4 may be adjusted to modify the amplitude of the harmonic second signal relative to the first signal. The second band pass filter 5 acts to remove from the harmonic second signal any extraneous harmonics which may have been introduced by the second amplifier 4 and/or any remaining traces of the original frequency $f_{LO}$ which may have been passed by the tripler 3.

The first signal and the harmonic second signal are recombined in a signal adder 9 to form a combined electrical driving signal. The adjustable phase shifter 6 ensures that the first signal and the harmonic second signal have a predetermined phase difference when they are recombined, despite the other operations carried out on them.

The first variable gain amplifier 7 may be operated in conjunction with the second amplifier 4 to adjust the relative amplitude of the two signals, and may also be employed to ensure that the combined electrical driving signal is of a sufficient net amplitude to act as a driving signal.

The combined electrical driving signal is employed to drive a Mach-Zehnder modulator 10, acting to vary the refractive index of one optical path 11, such that when light passing therethrough is recombined with light passing through an unaffected parallel optical path 12, constructive or destructive interference. may occur, converting a continuous wave light input entering the Mach-Zehnder modulator 10 through an input waveguide 13 into an optical pulse train leaving the Mach-Zehnder modulator 10 through an output waveguide 14.

The combination of the sinusoidal combined electrical driving signal of fundamental frequency $f_{LO}$ with the substantially sinusoidal response curve of the Mach-Zehnder modulator normally gives an optical pulse train of frequency $2f_{LO}$.

Figure 2:
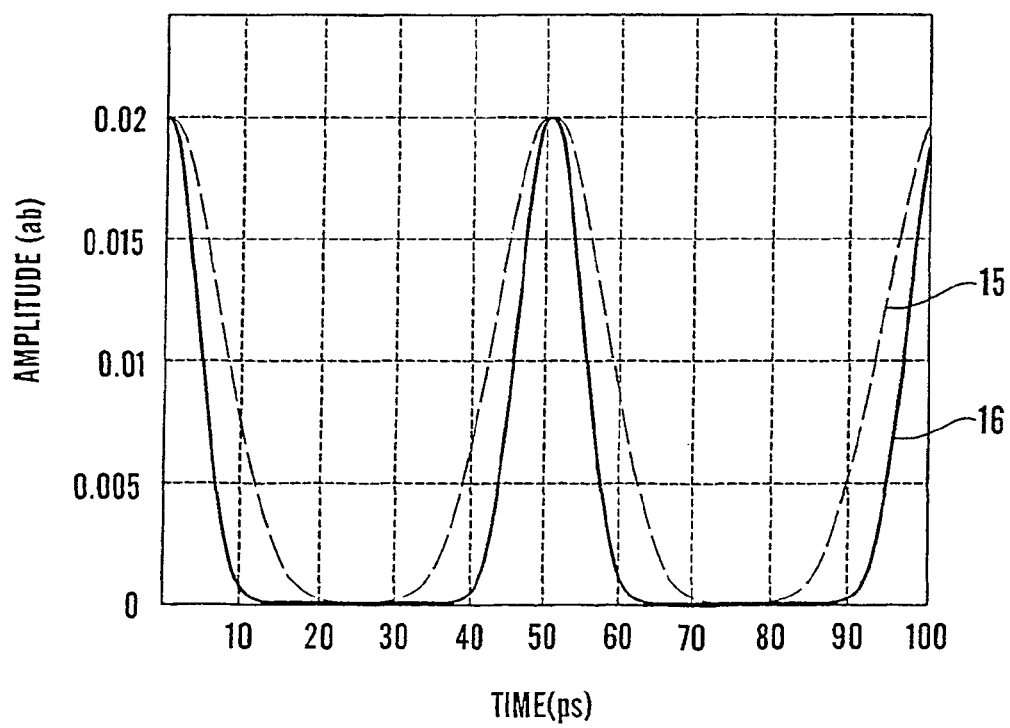
FIG. 2 is a plot of optical intensity versus time for an optical output signal from a conventional electro-optical gating device and for an optical output signal from the device of FIG. 1.

FIG. 2 shows a dashed curve 15 of optical intensity (on an arbitrary amplitude scale) against time for pulses generated by a Mach-Zehnder modulator driven by a simple single frequency electrical driving signal. The duty cycle for this dashed curve 15 is approximately 0.35. A solid curve 16 represents pulses generated by a Mach-Zehnder modulator driven by a signal generated as described above, comprising a combined fundamental first signal and a third harmonic thereof. The duty cycle of the solid curve 16 can be as low as 0.19, depending on the relative amplitude of the fundamental signal and the third harmonic signal.

The phase control between the fundamental signal and the harmonic signal can be achieved using a 90-degree hybrid in reflection, where the ports are terminated with varactors. The phase is adjusted by varying the capacitances of the varactors.

The frequency tripler 3 will in normal operation produce a third harmonic signal which is 180° out of phase with the fundamental signal. This phase difference may be inverted by means of a switched filter network, comprising a low pass filter and a high pass filter in parallel. Switching between these filters inverts the phase of the signal. The switched filter network may act on the harmonic signal or alternatively on the fundamental signal, in which case it may comprise a part of the adjustable phase shifter 6.

In further embodiments of the invention, the phase of the third harmonic signal is not inverted. A combined electrical driving signal comprising the fundamental signal and a third harmonic signal 180° out of phase therewith drives a Mach-Zehnder modulator to give pulses with a duty cycle greater than the value of 0.35 achieved without the third harmonic signal. The duty cycle may then be adjusted to give values of up to approximately 0.5.

In some embodiments of the invention, the first and second band pass filters 8,5 may be combined with the signal adder 9 to form a diplexer.

In place of one or each of the variable gain amplifiers 4,7, it may be possible to employ a variable attenuator, given a sufficient amplitude of signal from the oscillator 1. Any reference to amplifiers or amplification herein should therefore be taken to include attenuators or attenuation, respectively.

In practice, modulators used in such a device must have sufficiently high bandwidth to respond to the third harmonic signal. Limited modulator bandwidth may require the amplitude of the third harmonic signal to be raised relative to that of the fundamental signal to obtain the required effect on the duty cycle. For example, an ideal modulator requires a third harmonic signal with an amplitude of approximately 15 dB below that of the fundamental signal to produce the minimum duty cycle. A practical modulator, experiencing such frequency roll-off, may require an increase in relative amplitude of the third harmonic signal to optimise the duty cycle produced. The total driving power required need not be changed significantly thereby.

Since a fundamental frequency $f_{LO}$ leads to a gating frequency $2f_{LO}$, a device intended to work at a gating frequency $f_g$ requires a modulator with a maximum frequency response above $1.5f_g$; i.e. for 20 Gb/s data transmission, the oscillator must supply a 10 GHz fundamental signal, and the modulator must be capable of responding to a 30 GHz third harmonic component of the driving signal.

Figure 3:
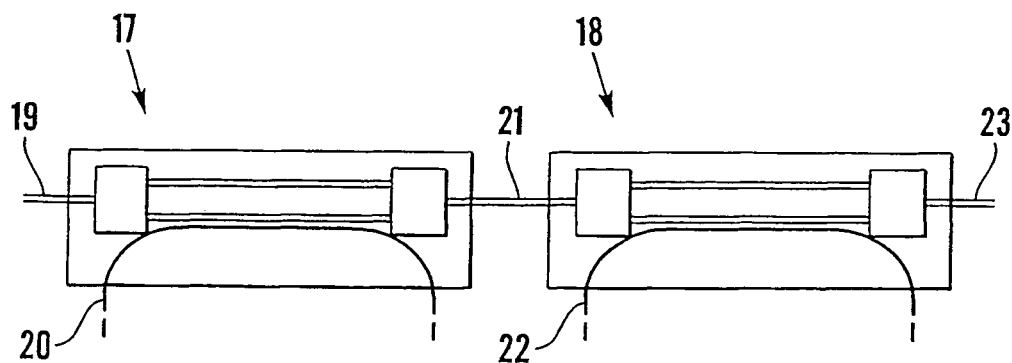
FIG. 3 is a schematic representation of an electro-optical gating device comprising two modulators.

FIG. 3 shows part of a device comprising two Mach-Zehnder modulators 17,18 arranged in series. A continuous wave optical input enters a first Mach-Zehnder modulator 17 by an input waveguide 19. The modulator 17, driven via a first electrode 20, produces a first optical pulse train which is passed by a transfer waveguide 21 to a second Mach-Zehnder modulator 18. This is driven via a. second electrode 22, and produces a second optical pulse train which leaves the modulator 18 via an output waveguide 23.

In alternative embodiments of the device, the two modulators 17,18 maybe driven via a single common electrode, replacing the electrodes 20,22 on each modulator. It is important that the two modulators 17,18 of the device of FIG. 3 act in phase on the optical signal passing therethrough, and so the driving signals passed to the electrodes 20,22 should originate from a common oscillator 1, or indeed from a common signal adder 9. This may for example be achieved by connecting the electrodes 20,22 in series. A phase shifter may be required between the electrodes 20,22 to compensate for the delay in passing the signal from one electrode to the other. Alternatively, it may in some cases be possible to lengthen the transfer waveguide 21 to impose a corresponding delay into the optical path. At data transmission rates of around 40 Gb/s, individual pulses can be as little as twenty-five picoseconds apart, corresponding to an optical path length of around five millimetres.

Figure 4:
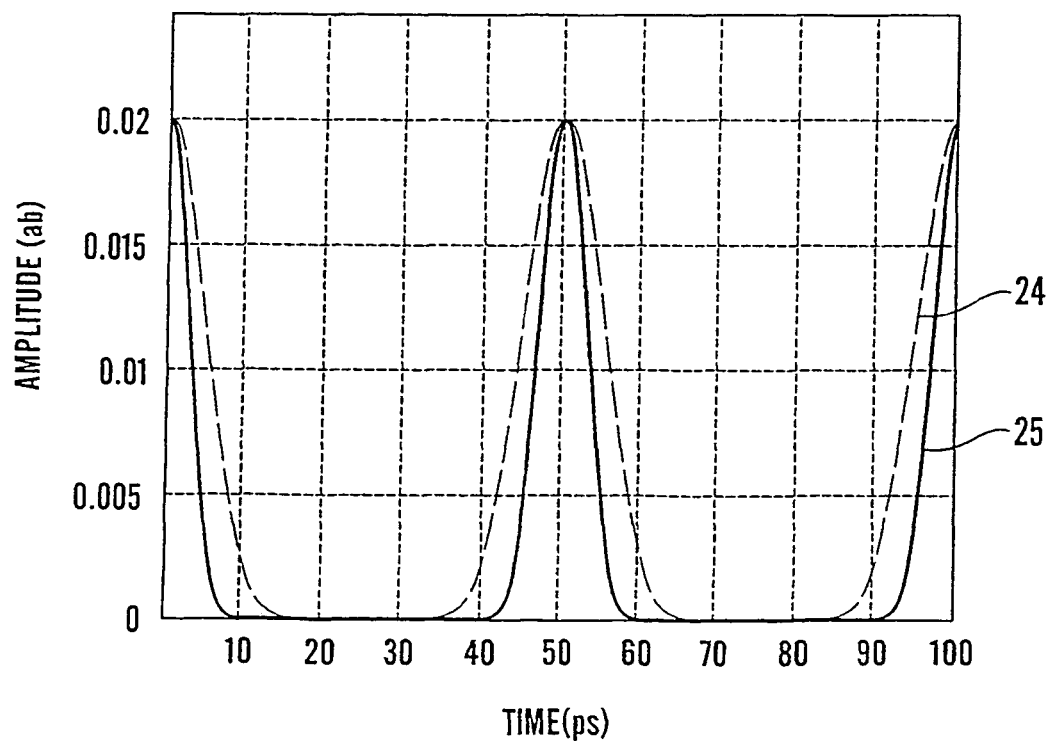
FIG. 4 is a plot of optical intensity versus time for an optical output signal from a conventional electro-optical gating device comprising two modulators and for an optical output signal from the device of FIG. 3.

As shown by dashed curve 24 of FIG. 4, a pulse train from a device as in FIG. 3, driven by a simple single-frequency electrical driving signal to each modulator, has a lower duty cycle than is achievable with a single modulator. The duty cycle shown is approximately 0.22. Solid curve 25 represents a pulse train from a device as in FIG. 3, wherein both modulators are driven by a combined electrical driving signal comprising a fundamental signal and a third harmonic thereof. The duty cycle achievable thereby can be adjusted to be as low as 0.13. This gives the opportunity to carry out threefold multiplexing and demultiplexing of transmitted optical data.

The particular examples above have been described in terms of optical pulse train generation. It is clear that similar systems may be employed to drive modulators for the purpose of multiplexing and/or demultiplexing optical data streams.

The term optical herein should be understood to comprise any electromagnetic frequency on which a Mach-Zehnder type modulator may act as a gating device. Conventional optical data transmission networks operate at a wavelength of around 1550 nm, in the infrared region, but devices described herein are equally applicable to visible light or ultraviolet light pulses.

An electro-optical gating device as described herein allows the convenient generation, multiplexing and demultiplexing of trains of RZ optical pulses at extremely high data transmission rates, which cannot easily or economically be achieved by other means.

What is claimed is:

1. An electro-optical gating device for generating a pulse stream with adjustable pulse width for use in an optical communication system using a return-to-zero signaling format, the device comprising oscillator means to generate a substantially sinusoidal input electrical signal of a predetermined frequency $f_{LO}$, means to split said input electrical signal into first and second signals, variable amplifier or attenuator means adapted to allow adjustment of an amplitude of said second signal relative to an amplitude of said first signal, means to triple the frequency of said second signal to $3f_{LO}$, means to recombine said tripled second signal with said first signal to produce a combined electrical signal, and a Mach-Zehnder modulator with a substantially sinusoidal response curve and arranged to be biased for maximum optical transmission adapted to be driven by said combined electrical signal to produce an optical pulse train at twice the frequency of the input electrical signal with an adjustable duty cycle.

2. The gating device as claimed in claim 1, wherein said amplifier is adapted to act on the first signal.

3. The gating device as claimed in claim 1, further comprising signal filtering means for removing from one or both of said first and second signals components added thereto by the amplifier.

4. The gating device as claimed in claim 1, further comprising adjustable phase shifting means adapted for controlling the phase between the first and second signals.

5. The gating device as claimed in claim 1, further comprising phase inversion means for inverting the phase of one of said second signal and said first signal.

6. The gating device as claimed in claim 1, comprising at least two Mach-Zehnder modulators adapted to act in series on a single input optical signal, and adapted to be driven by a single combined electrical signal.

7. The gating device as claimed in claim 6, further comprising phase adjustment means to ensure that said at least two Mach-Zehnder modulators act in phase on said single input optical signal.

8. The gating device as claimed in claim 1, comprising a monolithic microwave integrated circuit.

9. The gating device as claimed in claim 1, further comprising means for generating an optical pulse train output from a continuous optical input.

10. The gating device as claimed in claim 1, further comprising means for demultiplexing an optical pulse train from an aggregate optical pulse stream having a plurality of multiplexed optical pulse trains.

11. A method for driving a Mach-Zehnder modulator with a substantially sinusoidal response curve and which is biased for maximum optical transmission, the method comprising the steps of generating a substantially sinusoidal input electrical signal of a predetermined frequency $f_{LO}$, splitting said input electrical signal into first and second signals, amplifying or attenuating the second signal relative to the first signal, tripling the frequency of the second signal to $3f_{LO}$, recombining the first signal and the tripled second signal to produce a combined electrical signal, and applying said combined electrical signal to the modulator as a driving signal to produce a pulse stream at twice the frequency of the input electrical signal with an adjustable duty cycle for use in an optical communication system using a return-to-zero signaling format.

12. The method as claimed in claim 11, further comprising the step of shifting the phase of either the second signal or the first signal so as to be in phase when recombined.

13. The method as claimed in claim 11, further comprising the step of shifting the phase of either the second signal or the first signal so as to be 180° out of phase when recombined.

14. The method as claimed in claim 11, further comprising the step of providing a continuous optical input to the Mach-Zehnder modulator to generate an optical pulse train output.

15. The method as claimed in claim 11, further comprising the step of providing an aggregate optical pulse stream having a plurality of multiplexed optical pulse trains to the Mach-Zehnder modulator to demultiplex a particular optical pulse train.

* * * * *